US012672337B2

(12) United States Patent
Zhang et al.

(10) Patent No.: US 12,672,337 B2
(45) Date of Patent: Jun. 30, 2026

(54) HIGH-TEMPERATURE IMPLANT FOR GATE-ALL-AROUND DEVICES

(71) Applicant: Applied Materials, Inc., Santa Clara, CA (US)

(72) Inventors: Yan Zhang, Westford, MA (US); Kyu-Ha Shim, Andover, MA (US); Johannes M. Van Meer, Middleton, MA (US); Naushad K. Variam, Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 451 days.

(21) Appl. No.: 18/327,048

(22) Filed: May 31, 2023

(65) Prior Publication Data

US 2024/0404887 A1 Dec. 5, 2024

(51) Int. Cl.
| | |
|---|---|
| *H10D 84/01* | (2026.01) |
| *H10D 84/03* | (2025.01) |
| *H10P 30/20* | (2026.01) |

(52) U.S. Cl.
CPC ....... *H10D 84/017* (2025.01); *H10D 84/0172* (2025.01); *H10D 84/0181* (2025.01); *H10D 84/038* (2025.01); *H10P 30/20* (2026.01)

(58) Field of Classification Search
CPC ............. H10D 84/017; H10D 84/0172; H10D 84/0181; H10D 84/038; H10D 84/0167; H10D 84/851; H10D 88/01; H10D 88/00; H01L 21/265; H01L 27/092
See application file for complete search history.

(56) References Cited

U.S. PATENT DOCUMENTS

| | | | | |
|---|---|---|---|---|
| 2006/0234519 A1* | 10/2006 | Pan | | H10D 30/014 |
| | | | | 257/E29.241 |
| 2014/0054679 A1* | 2/2014 | Tang | | H10D 30/62 |
| | | | | 257/329 |
| 2019/0006492 A1* | 1/2019 | Wang | | H01L 21/266 |
| 2020/0105751 A1* | 4/2020 | Dewey | | H10D 62/235 |
| 2020/0135887 A1* | 4/2020 | Wu | | H10D 84/0193 |
| 2021/0265345 A1* | 8/2021 | Xie | | H10D 62/116 |
| 2022/0102529 A1* | 3/2022 | Huang | | H10D 30/475 |
| 2022/0230922 A1* | 7/2022 | Chen | | H10D 30/6735 |
| 2023/0054701 A1* | 2/2023 | Xie | | H10D 30/43 |

* cited by examiner

*Primary Examiner* — William B Partridge
*Assistant Examiner* — David Paul Sedorook
(74) *Attorney, Agent, or Firm* — KDW Firm PLLC

(57) ABSTRACT

Approaches herein provide devices and methods for forming gate-all-around transistors with improved NBTI. One method may include forming a gate-all-around (GAA) stack including a plurality of alternating first layers and second layers, and forming a source/drain (S/D) cavity through the plurality of alternating first layers and second layers. The method may further include forming an inner spacer in the S/D cavity, adjacent the plurality of alternating first layers and second layers, performing a first implant by directing fluorine ions to the GAA stack, through the S/D cavity, and forming a S/D material in the S/D cavity following the first implant.

19 Claims, 6 Drawing Sheets

100

121

122

152

130

134

106

116 oxide

108

104

HIGH-TEMPERATURE IMPLANT FOR GATE-ALL-AROUND DEVICES

FIELD OF THE DISCLOSURE

The present embodiments relate to semiconductor device patterning, and more particularly, to devices and techniques for forming gate-all-around transistors using a high-temperature implant.

BACKGROUND OF THE DISCLOSURE

As integrated circuit (IC) technologies progress towards smaller technology nodes, multi-gate devices have been used to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors, both also referred to as non-planar transistors, are examples of multi-gate devices that provide high performance and low leakage applications. The channel region of GAA transistors may be formed from nanowires, nanosheets (NS), or other nanostructures.

Successful integration of different multi-gate devices, including nanowire and/or NS transistors, on one integrated circuit, is challenging. For example, the geometry and reduced cross-section of nanosheet transistors leads to increased Negative Bias Temperature Instability and, therefore, to reliability issues in Si channel p-type NS. Currently known implants for pFinFETs are not suitable for pNS, however, due to the non-line-of-sight between NS interfaces.

Accordingly, improved approaches are needed for forming GAA transistors.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include forming a gate-all-around (GAA) stack comprising a plurality of alternating first layers and second layers, and forming a source/drain (S/D) cavity through the plurality of alternating first layers and second layers. The method may further include forming an inner spacer in the S/D cavity, adjacent the plurality of alternating first layers and second layers, performing a first implant by directing fluorine ions to the GAA stack, through the S/D cavity, and forming a S/D material in the S/D cavity following the first implant.

In another aspect, a method for forming a gate-all-around (GAA) device may include forming a nanowire stack comprising a plurality of alternating first layers and second layers, and forming a source/drain (S/D) cavity through the plurality of alternating first layers and second layers. The method may further include forming an inner spacer in the S/D cavity, adjacent the plurality of alternating first layers and second layers, and performing a first implant by directing fluorine ions into the nanowire stack, through the S/D cavity, wherein the fluorine ions are directed into the nanowire stack at a non-zero angle relative to a plane defined by a sidewall surface of the inner spacer. The method may further include annealing the nanowire stack at a first temperature after the first implant is performed.

In yet another aspect, a system may include a processor and a memory storing instructions executable by the processor to perform a first implant by directing fluorine ions into a gate-all-around (GAA) stack comprising a plurality of alternating first layers and second layers, wherein the fluorine ions are directed through a source/drain cavity formed adjacent the GAA stack, and wherein the fluorine ions are directed into the GAA stack at a non-zero angle relative to a plane defined by a sidewall surface of an inner spacer, and wherein the inner spacer is formed along the GAA stack before the fluorine ions are directed through a source/drain cavity.

BRIEF DESCRIPTION OF THE DRAWINGS

The accompanying drawings illustrate exemplary approaches of the disclosure, including the practical application of the principles thereof, as follows.

Figure 1:
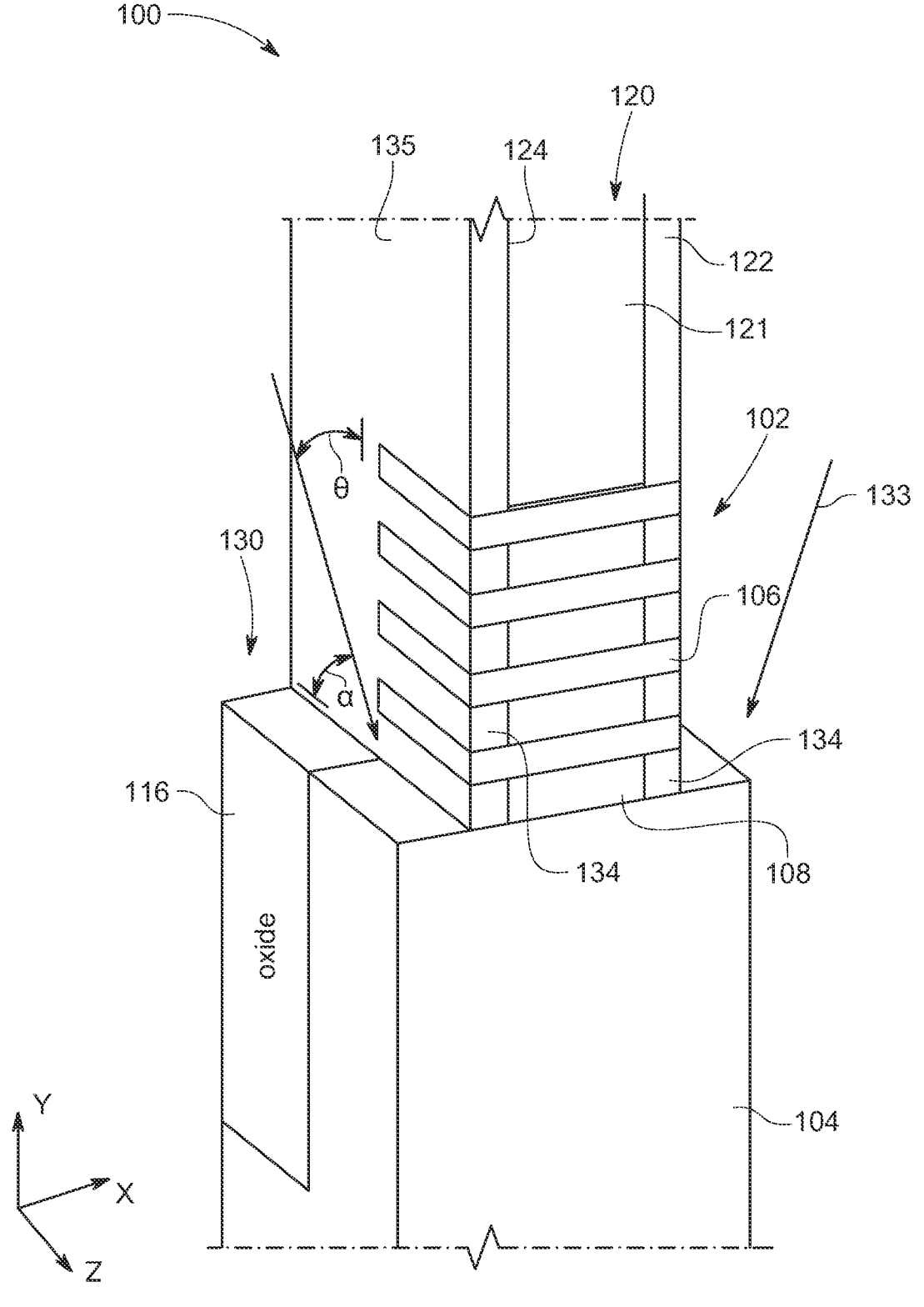
FIG. 1 illustrates a perspective view of an exemplary device following a S/D cavity formation, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, systems, and devices in accordance with the present disclosure will now be described more fully hereinafter with reference to the accompanying drawings, where various embodiments are shown. The methods, systems, and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein are directed to formation of gate-all-around (GAA) transistors in which a source/drain (S/D) cavity is implanted with fluorine for NBTI improvement. Advantageously, both the outer and inner Si/interlayer (IL) interfaces are doped uniformly, with low risk of damage on Si nanosheet (NS) as well as Si/IL interfaces. In some embodiments, the implant is a high-temperature fluorine implant performed at a temperature no less than 500° C.

With reference to FIG. 1, an approach for forming a semiconductor device (hereinafter "device") 100 according to one or more embodiments will be described. The device 100 may be a GAA device structure, a vertical GAA device structure, a horizontal GAA device structure, or a fin-like field effect transistor (FinFET) device structure. In some embodiments, the device 100 may be a stacked nanosheet complementary field effect transistor (CFET) device having a GAA structure. As shown, the device 100 may include a GAA stack 102 (sometimes referred to herein as a nanosheet stack) including a substrate base 104 and a plurality of alternating first layers 106 and second layers 108 formed over the substrate base 104.

The term 'nanosheet,' as used herein, refers to a sheet or a layer having nanoscale dimensions. Further, the term 'nanosheet' is meant to encompass other nanoscale structures such as nanowires. For instance, 'nanosheet' can refer to a nanowire with a larger width, and/or 'nanowire' can refer to a nanosheet with a smaller width, and vice versa.

According to an exemplary embodiment, substrate base 104 may be a bulk semiconductor wafer, such as a bulk silicon (Si), bulk germanium (Ge), bulk silicon germanium (SiGe) and/or bulk III-V semiconductor wafer. Alternatively, the substrate base 104 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. The substrate base 104 may already have pre-built structures (not shown) such as transistors, diodes, capacitors, resistors, interconnects, wiring, etc.

In various embodiments, the plurality of alternating first layers 106 and second layers 108 may include two to ten first layers 106 and two to ten second layers 108. A composition of the first layers 106 may be different than a composition of the second layers 108 to achieve etching selectivity and/or different oxidation rates during subsequent processing, for example. In some embodiments, the plurality of alternating first layers 106 and second layers 108 may include different materials, different constituent atomic percentages, different constituent weight percentages, and/or other different characteristics to achieve desired etching selectivity.

In the present embodiment, the first layers 106 may include silicon (Si) and the second layers 108 may include silicon germanium (SiGe), which has a different etch selectivity than silicon. Although non-limiting, a thickness of each first layer 106 may be about 1 nm to about 10 nm, a thickness of each second layer 108 may be about 1 nm to about 10 nm, and the two thicknesses can be the same or different. Although non-limiting, the plurality of alternating first layers 106 and second layers 108 may be epitaxially grown in the depicted interleaving and alternating configuration, layer-by-layer, until a desired number of semiconductor layers is reached.

The nanosheet stack 102 may be processed (e.g., etched) to form a plurality of structures, or nanosheets, only one of which is shown, extending in a vertical direction from the substrate base 104. Each of the nanosheets may include a set of opposing sidewall surfaces. Adjacent nanosheets may be separated by a trench. The nanosheets may be patterned by any suitable method. For example, the nanosheets may be patterned using one or more photolithography processes, including double-patterning or multi-patterning processes.

Generally, double-patterning or multi-patterning processes combine photolithography and self-aligned processes, allowing patterns to be created that have, for example, pitches smaller than what is otherwise obtainable using a single, direct photolithography process. Embodiments herein are not limited in this context.

As further shown, a dielectric material may be partially filled into a trench to form a shallow trench isolation (STI) layer 116 in the substrate base 104. The STI layer 116 may comprise at least one of silicon oxide, silicon nitride, and carbon. The STI layer 116 may be deposited by any deposition method such as flowable CVD (FCVD), PECVD, PVD, ALD, and MOCVD.

A dummy gate structure may then be formed over the nanosheet stack 102, as shown. The dummy gate structure may be formed atop the STI layer 116. In some embodiments, the dummy gate structure is a sacrificial gate including a gate material layer 121, wherein the gate material layer 121 may be formed atop an etch stop layer 126. In some embodiments, the gate material layer 121 may be an amorphous silicon (a-Si) or a polysilicon.

As further shown, a plurality of outer gate spacers 122 may be formed over the device 100, along a sidewall 124 of the dummy gate 120. The outer gate spacers 122 may then be partially removed (e.g., etched), as demonstrated, to expose a portion of the nanosheet stack 102, namely, the plurality of alternating first layers 106 and second layers 108. Partially removing the gate spacers 122 causes a source/drain (S/D) cavity 130 to be formed through the plurality of alternating first layers and second layers 106, 108. Although non-limiting, the outer gate spacers 122 may be formed of a dielectric material such as silicon nitride, silicon oxide, silicon carbo-nitride, silicon oxynitride, silicon oxy carbo-nitride, or the like, and may have a single-layer structure or a multi-layer structure including a plurality of dielectric layers. After formation of the S/D cavity 130, a lateral selective dry etch may be performed to trim the SiGe second layers 108 slightly (e.g., a few nm) to form gaps between Si nanosheets. One or more low-k materials may then be used to fill these gaps and form an inner spacer 134. In various non-limiting embodiments, low-k materials may include a dielectric having a dielectric constant less than about 7, for example, less than about 5 or even less than about 2.5, such as carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof.

A first implant process may then be performed whereby fluorine ions 133 are directed into the GAA stack 102, after formation of the S/D cavity 130 and inner spacer 134. The fluorine ions 133 are directed into the exposed surfaces of the GAA stack 102 and into the inner spacer 134 at a non-zero angle $\Theta$ relative to a plane (y-z plane) defined by an exterior surface 135 of the gate spacers 122. In some embodiments, the first implant is performed at a temperature no less than approximately 500 degrees Celsius using a Thermion implant tool to reduce damage on Si of the GAA stack 102. Furthermore, in some embodiments, twist and tilt angles (e.g., angle $\alpha$) of the fluorine ions 133 can be adjusted to enable adequate doping and uniformity. An optional annealing process may then be performed (e.g., rapid thermal anneal (RTA)) to drive the fluorine into the channel regions without fluorine outgassing.

Figure 2:
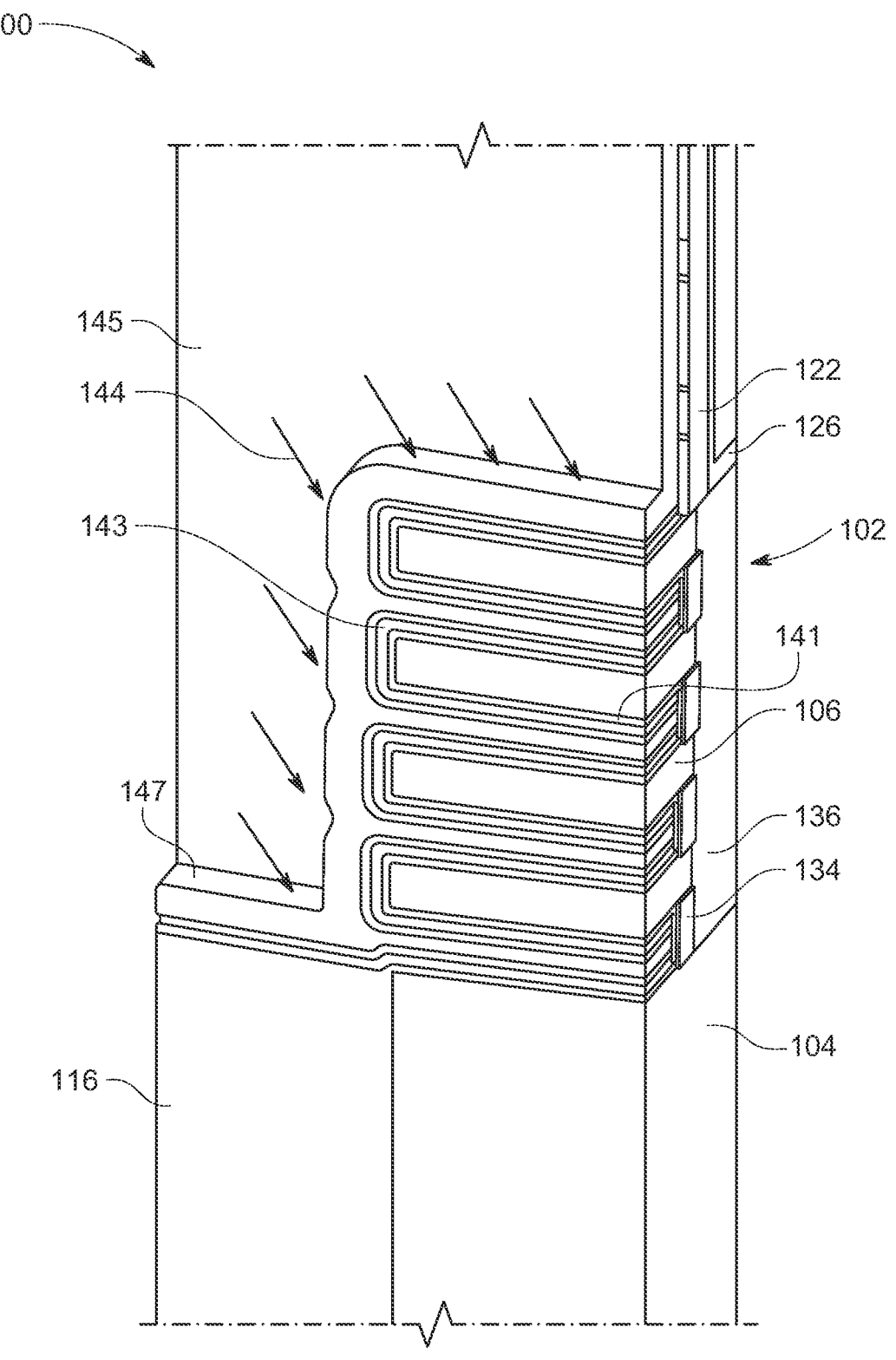
FIG. 2 illustrates a perspective view of the exemplary device following portions of a RMG formation, according to embodiments of the present disclosure.

Next, as shown in FIG. 2, a S/D material may then be epitaxially formed within the S/D cavities 130, to form a S/D 136. In some embodiments, an epitaxy process may use chemical vapor deposition (CVD) techniques (e.g., vapor phase epitaxy and/or Ultra-High Vacuum CVD), molecular beam epitaxy, other suitable epitaxial growth processes, or combinations thereof, to form the S/D 136. The epitaxy process can use gaseous and/or liquid precursors, which interact with the composition of the substrate base 104 and the first layers 106 of the GAA stack 102. As shown, the S/D 136 may be in direct contact with the first layers 106 and in direct contact with the inner spacers 134.

In some embodiments, the S/D 136 may be doped with p-type dopants. For p-type transistors, the S/D 136 may include silicon germanium or germanium, and can be doped with boron, other p-type dopant, or combinations thereof (for example, forming Si:Ge:B epitaxial source/drain features). Furthermore, the doping can be in-situ (i.e., doped during deposition by adding impurities to a source material of the epitaxy process) or ex-situ (e.g., doped by an ion implantation process subsequent to a deposition process). In some embodiments, an annealing process (e.g., rapid thermal annealing (RTA) and/or laser annealing) may be performed to activate dopants in the S/D 136.

As further shown, the device 100 may be further processed using a RMG sequence whereby second layers 108 are removed from the GAA stack 102 using, for example, a wet etch process. In some embodiments, the etch process may be a lateral SiGe etch performed by a selective rapid plasma etch (SRP) device-optimized to remove the second layers 108. Various etching parameters can be tuned to achieve selective etching, such as etchant composition, etching temperature, etching solution concentration, etching time, etching pressure, source power, RF bias voltage, RF bias power, etchant flow rate, other suitable etching parameters, or combinations thereof. In some embodiments, the etch may be a selective isotropic dry etching process (e.g., a surface gas/radical reaction process) to the second layers 108 with a fluorine-containing gas (e.g., HF, $F_2$, $NF_3$, $CF_4$, $SF_6$, $CH_2F_2$, $CHF_3$, and/or $C_2F_6$). In some embodiments, a ratio of the fluorine-containing gas to an oxygen-containing gas (e.g., $O_2$), an etching temperature, and/or an RF power may be tuned to selectively etch the second layers 108.

As further shown in FIG. 2, a gate dielectric 141 (e.g., oxide) and a high-k material 143 may be formed over the first layers 106. As shown, the gate dielectric 141 and the high-k material 143 may be conformally formed over the exposed surfaces of the first layers 106. A post deposition anneal (PDA) may be performed, e.g., at a temperature greater than approximately 700° C., followed by formation of a capping layer or etch stop layer 145 (e.g., titanium nitride (TiN)/amorphous silicon (aSi) layer), which is conformally deposited between the first layers 106 and over the high-K material 143.

In some embodiments, an optional second implant process may then be performed whereby fluorine ions 144 are directed into the GAA stack 102. The fluorine ions 144 are directed into GAA stack 102 at a non-zero angle relative to an upper surface 147 of the etch stop layer 145, and may be twisted perpendicular to the channel direction. In some embodiments, the second implant is performed at a temperature higher than 150 degrees Celsius using a Thermion implant tool to reduce damage on Si and Si/IL interfaces of the GAA stack 102. In some embodiments, the temperature of the first implant shown in FIG. 1 may be greater than the temperature the second implant. A post cap annealing (PCA) process may then be performed, e.g., at a temperature greater than 900° C. Although not shown, processing of the device 100 may then continue, as conventionally known.

Figure 3:
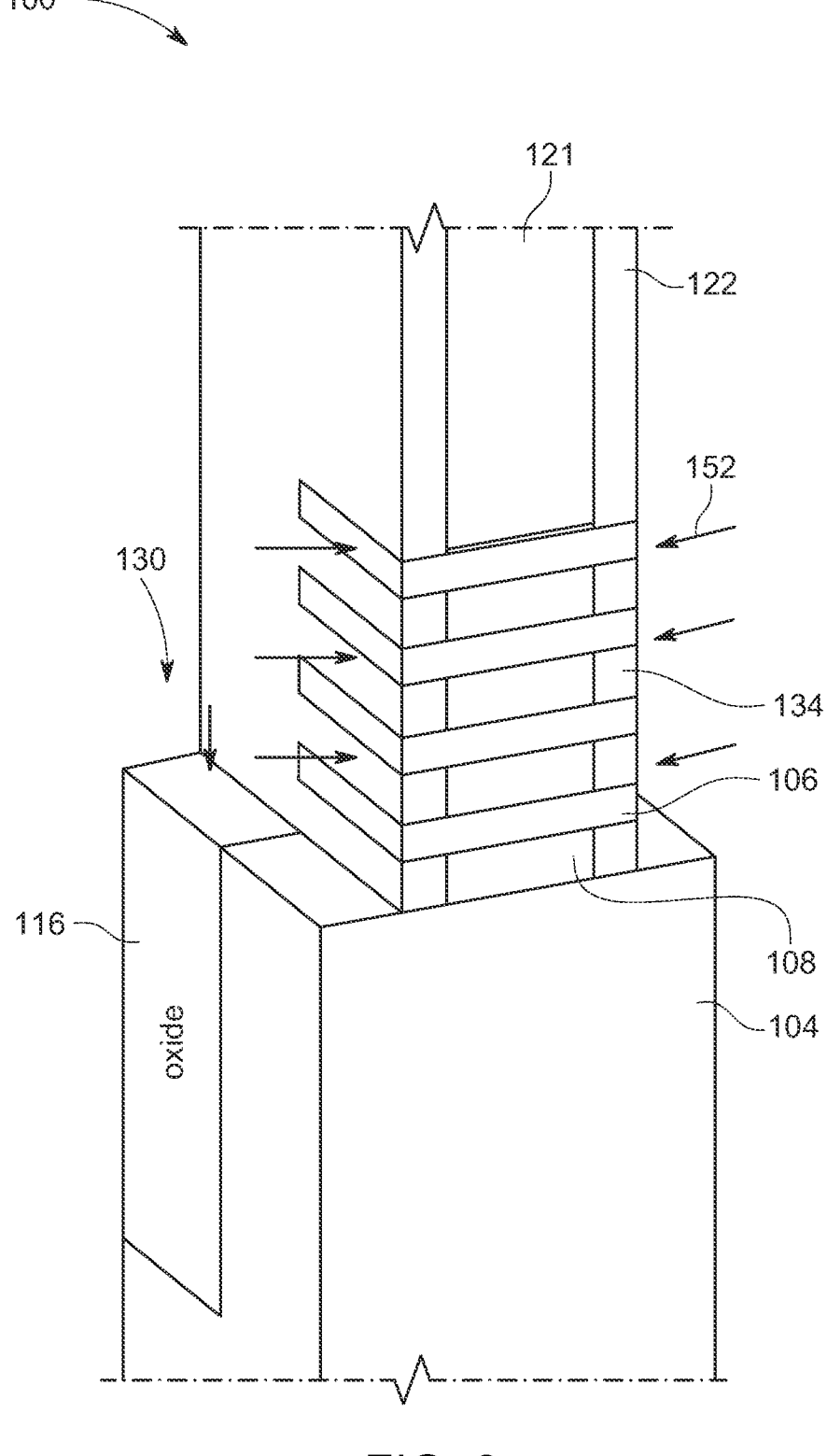
FIG. 3 illustrates a perspective view of an exemplary device during a PLAD process, according to embodiments of the present disclosure.

FIG. 3 demonstrates an alternative sidewall implant 152 approach, which may be performed to the inner spacer 134 and to the GAA stack 102 after the cavities 130 and inner spacer 134 are formed. In this embodiment, the sidewall implant 152 is a plasma treatment, e.g., plasma doping (PLAD) or decoupled plasma treatment (DPX), which impacts the GAA stack 102, including the first and second layers 106, 108. This plasma doping is preferably done at high temperature to avoid any potential damage on Si along the sidewall. In various embodiments, the sidewall implant 152 may be delivered at a horizontal angle relative to the GAA stack 102, as shown, and/or vertically. In the example shown, the sidewall implant 152 may simultaneously impact the STI layer 116, the substrate base 104, and the GAA stack 102, including the inner spacer 134 and the first layers 106. Although non-limiting, the sidewall implant 152 may be plasma treatment including fluorine, wherein the plasma dose may be constant or variable. As a result of the sidewall implant 152, uniformity is improved and damage is minimized on the GAA stack 102. In some embodiments, a low temp (e.g., approximately 500 C or lower) RTA post fluorine implant may be performed to drive the fluorine into the channel regions without F outgassing.

Figure 4:
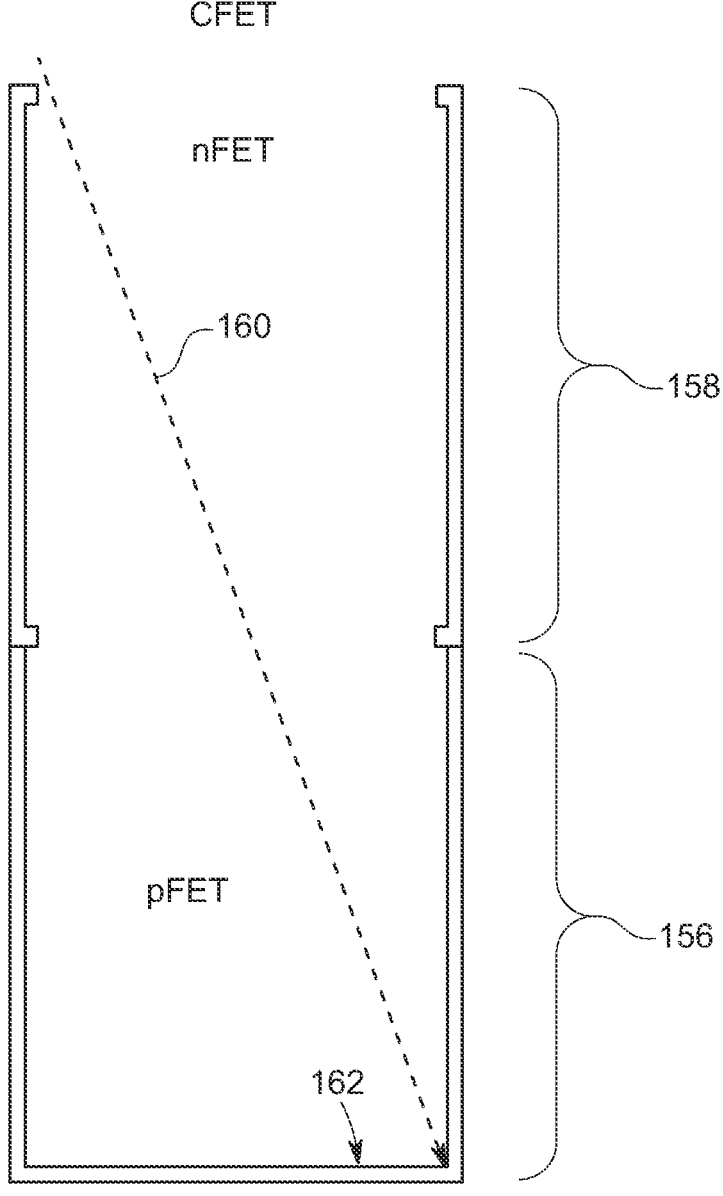
FIG. 4 illustrates a side view of a CFET during an implant process, according to embodiments of the present disclosure.

One beneficial application of this approach is demonstrated in FIG. 4, which shows a CFET S/D cavity including a pNS 156 beneath an nNS 158. More specifically, the lower nanosheets (not shown) in the stack will form a device of a first polarity, i.e., a PFET or an NFET, and the upper nanosheets (not shown) in the stack will form a device of a second/opposite polarity, i.e., an NFET if the lower device is a PFET, or vice versa. Gates of the CFET device are oriented orthogonal to the nanosheets. Due to this top-bottom arrangement, a large aspect ratio is present, for which conventional beam-line ion implant is not applicable due to shadowing effect. PLAD is the only option that could dope the sidewall of the S/D cavity of the CFET. In various embodiments, PLAD may dope N and/or P type dopants.

Figure 5:
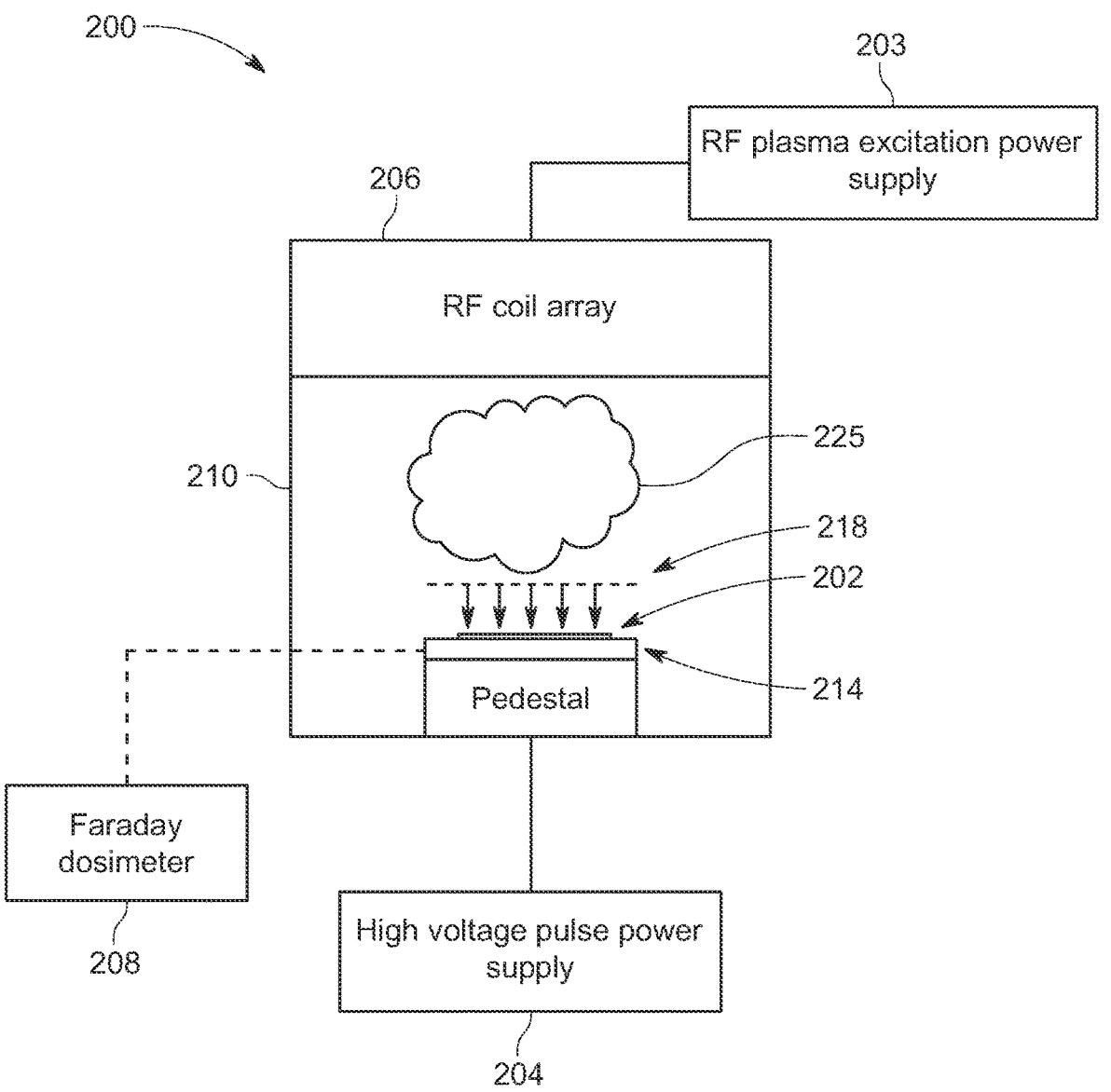
FIG. 5 illustrates a perspective view of an exemplary system, according to embodiments of the present disclosure.

Referring to FIG. 5, an example system 200 (e.g., a PLAD system) operable to provide pulsed RF-excited continuous plasma doping to the device 100 of FIG. 3, will be described. As shown, the system 200 may include a plasma power supply 203, a voltage pulse power supply 204, an RF coil array 206, and a dosimeter 208. Within a plasma chamber 210 is a wafer/substrate 202, which may be the same or similar to the substrate base 104 described above. A platen/pedestal 214 may support the wafer 202, and a sheath 218 may be formed above the wafer 202. The dosimeter 208 may be a Faraday dosimeter or other type of sensor that directly measures the dose of ions received by the wafer 202. Although non-limiting, the dosimeter can be located on the pedestal 214, proximate to the wafer 202.

During use, the plasma power supply 203 and the RF coil array 206 deliver radio frequency excitation to generate a plasma 225 when gaseous species are delivered into the plasma chamber 210. For example, the plasma power supply 203 may be an RF powered inductively coupled power source to generate inductively coupled plasma 225, as known in the art. Gaseous species may be delivered from one or more gas sources (not separately shown) to generate ions of any suitable species, such as fluorine.

The voltage pulse power supply 204 may generate a bias voltage between the wafer 202 and the plasma chamber 210. As such, when the voltage pulse power supply 204 generates a voltage between the plasma chamber 210 and the substrate 202, a similar, but slightly larger, voltage difference is generated between the plasma 225 and the substrate 202. In one non-limiting example, a 5000 (5 kV) voltage difference established between the plasma chamber 210 and the substrate 202 (or, equivalently, pedestal 214) may generate a voltage difference of approximately 5005 V to 5030 V between the plasma 225 and the substrate 202.

In some embodiments, the voltage pulse power supply 204 may generate a bias voltage as a pulsed voltage signal, wherein the pulsed voltage signal is applied in a repetitive and regular manner, to generate a pulse routine comprising a plurality of extraction voltage pulses. For example, a pulse routine may apply voltage pulses of 500 V magnitude, 1000 V magnitude, 2000 V magnitude, 5000 V magnitude, or 10,000 V magnitude in various non-limiting embodiments. The system 200 may further include a controller (not shown), to control the pulsing routine applied to the substrate 202, in order to provide the sidewall treatment 152.

According to various embodiments, the plasma 225 may be formed at least in part of ions that constitute an amorphizing species, wherein the amorphizing species may be any suitable ion capable of amorphizing an initially crystalline region of materials, such as the substrate 202. In various non-limiting embodiments, such suitable ions may include fluorine. When the plasma 225 is present in the plasma chamber 210, the controller may generate a signal for the voltage pulse power supply 204 to apply a pulse routine to the substrate 202, where the pulse routine constitutes a plurality of extraction voltage pulses. As such, when the extraction voltage pulses are applied between the substrate 202 and plasma 225, ions are extracted in pulsed form from the plasma 225, generating a plurality of ion pulses that are directed to the substrate 202.

Figure 6:
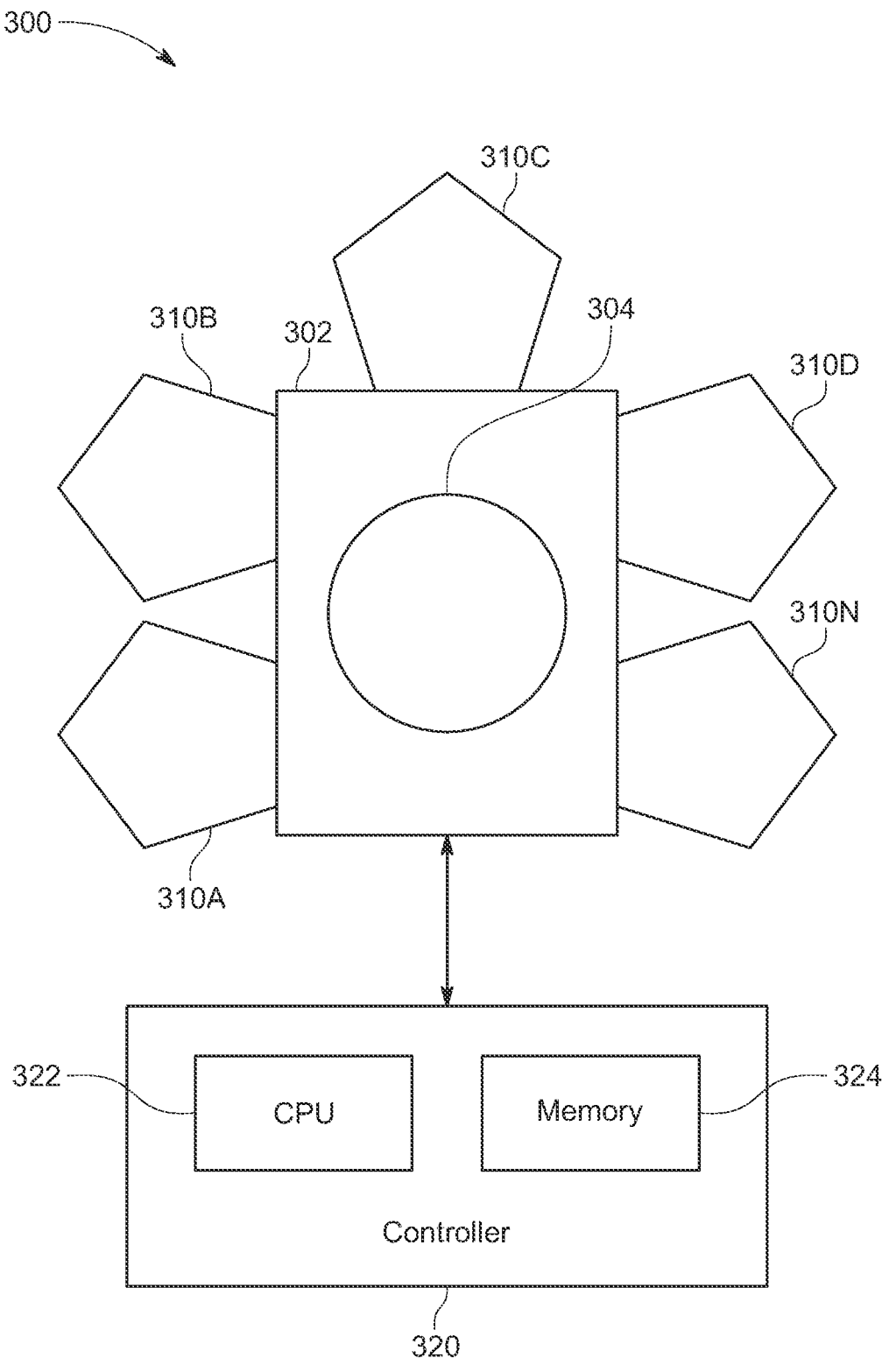
FIG. 6 shows a schematic of an example system, according to embodiments of the disclosure.

FIG. 6 shows a schematic of another example system/apparatus 300 according to embodiments of the disclosure. In some embodiments, the system 300 may be a cluster tool operable to perform processes necessary to form the device 100 described herein and shown in FIGS. 1-2. Although non-limiting, the system 300 may include at least one central transfer station/chamber 302 and one or more robots 304 within the transfer station/chamber 302, wherein the robot 304 is operable to move a robot blade and a wafer to and from each of a plurality of processing chambers 310A-310N connected with, or positioned adjacent to, the transfer station/chamber 302. In some embodiments, the processing chambers 310A-310N may support ion implantation, material deposition, and material etching. The particular arrangement of process chambers and components can be varied depending on the cluster tool, and should not be taken as limiting the scope of the disclosure. In another example, one or more of the chambers may include multiple process regions within a same chamber, which permits a common supply of gases, common pressure control, and common process gas exhaust/pumping. Modular design of the system enables rapid conversion from one configuration to any other.

In some embodiments, processing chamber 310A may be a deposition chamber operable to deposit the GAA stack 102 as alternating first layers 106 and second layers 108. The first deposition chamber 310A may be further used to deposit the plurality of inner gate spacers 122 along the sidewall 124 of each of the dummy gates 120 and along the plurality of alternating first layers 106 and second layers 108 of the nanosheet stack 102. In some embodiment, processing chamber 310A may be further operable to form the gate dielectric 141 over the first layers 106, form the S/D 136 in the S/D cavity 130 following the first implant, and to form the contact etch stop 136 over the S/D material after the GAA stack 102 is annealed. Although non-limiting, the deposition chamber may include one or more of an atomic layer deposition chamber, a plasma enhanced atomic layer deposition chamber, a chemical vapor deposition chamber, a plasma enhanced chemical vapor deposition chamber, or a physical deposition.

In some embodiments, processing chamber 310B may be an etch chamber operable to form the S/D cavities 130 through the plurality of alternating first layers and second layers 106, 108. The etch process may expose an upper surface of the STI layer 116 and the base substrate 104. Processing chamber 310B may be further operable to remove the second layers 108 from the GAA stack 102.

In some embodiments, processing chamber 310C may be operable to perform the first implant process in which fluorine ions 133 are directed into the GAA stack 102 following formation of the S/D cavity 130. The fluorine ions 133 may be directed into the exposed surfaces of the first and second layers 106, 108 and into the gate spacers 122 at a non-zero angle $\Theta$ relative to a plane defined by the exterior surface 135 of the gate spacers 122. In some embodiments, the first implant is performed at a temperature greater than approximately 500 degrees Celsius using a Thermion implant tool to reduce damage on Si of the GAA stack 102.

Processing chamber 310C may be further operable to perform the second implant process to direct fluorine ions 144 into the GAA stack 102 following formation of the etch stop layer 142. The fluorine ions 144 are directed into the exposed surfaces of the first layers 106 and the gate dielectric 141 at a non-zero angle relative to an upper surface of the gate dielectric 141. In some embodiments, the second implant is performed at a temperature between 300-500 degrees Celsius using a Thermion implant tool to reduce damage on Si of the GAA stack 102.

In some embodiments, processing chamber 310D may be operable to perform one or more annealing processes, such as the anneal to the GAA stack 102 following the first fluorine implant and the anneal(s) to the GAA stack 102 during RMG formation.

A system controller 320 is in communication with the robot 304, the transfer station/chamber 302, and the plurality of processing chambers 310A-310N. The system controller 320 can be any suitable component that can control the processing chambers 310A-310N and robot(s) 304, as well as the processes occurring within the process chambers 310A-310N. For example, the system controller 320 can be a computer including a central processing unit 322, memory 324, suitable circuits/logic/instructions, and storage.

Processes or instructions may generally be stored in the memory 324 of the system controller 320 as a software routine that, when executed by the processor 322, causes the processing chambers 310A-310N to perform processes of the present disclosure. The software routine may also be stored and/or executed by a second processor (not shown) that is remotely located from the hardware being controlled by the processor 322. Some or all of the method(s) of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor 322, transforms the general purpose computer into a specific purpose computer (controller) that controls the chamber operation such that the processes are performed.

In various embodiments, design tools can be provided and configured to create the datasets used to pattern the semiconductor layers of the device, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:

forming a gate-all-around (GAA) stack comprising a plurality of alternating first layers and second layers atop a substrate base;

forming a source/drain (S/D) cavity through the plurality of alternating first layers and second layers;

forming an inner spacer in the S/D cavity, adjacent the plurality of alternating first layers and second layers;

performing a first implant by directing fluorine ions to the GAA stack, through the S/D cavity at a first non-zero angle relative to a plane defined by a sidewall surface of the inner spacer in the S/D cavity, and at a second non-zero angle relative to a plane defined by an upper surface of the substrate base; and forming a S/D material in the S/D cavity following the first implant.

2. The method of claim 1, further comprising annealing the GAA stack at a first temperature after the fluorine ions are directed into the GAA stack.

3. The method of claim 2, wherein the first temperature is at least 500 degrees Celsius.

4. The method of claim 2, wherein the S/D material is epitaxially grown to form a S/D adjacent the inner spacer.

5. The method of claim 2, further comprising:

removing the second layers from the GAA stack after the S/D material is formed in the S/D cavity;

forming a gate dielectric and a high-k material over the first layers after the second layers are removed;

annealing the GAA stack after the gate dielectric and the high-k material are formed;

forming a contact etch stop layer after annealing the GAA stack; and performing a second implant by directing fluorine ions to the GAA stack after the contact etch stop layer is formed.

6. The method of claim 5, wherein the fluorine ions of the second implant are delivered into the GAA stack at a non-zero angle relative to an upper surface of the gate dielectric and rotated perpendicular to a channel direction, wherein the second implant is performed at a second temperature, and wherein the second temperature is higher than room temperature.

7. The method of claim 1, wherein the first implant comprises a plasma doping process.

8. The method of claim 1, wherein the GAA stack is part of a complementary field effect transistor comprising a p-type nanosheet beneath an n-type nanosheet, and wherein the S/D cavity is formed through the p-type nanosheet and the n-type nanosheet.

9. A method for forming a gate-all-around (GAA) device, comprising:

forming a nanowire stack comprising a plurality of alternating first layers and second layers atop a substrate base;

forming a source/drain (S/D) cavity through the plurality of alternating first layers and second layers;

forming an inner spacer in the S/D cavity, adjacent the plurality of alternating first layers and second layers;

performing a first implant by directing fluorine ions to the nanowire stack, through the S/D cavity, wherein the fluorine ions are directed into the nanowire stack at a first non-zero angle relative to a plane defined by a sidewall surface of the inner spacer and at a second non-zero angle relative to a plane defined by an upper surface of the substrate base; and epitaxially forming a S/D material in the S/D cavity following the first implant.

10. The method of claim 9, further comprising annealing the nanowire stack at a first temperature after the first implant is performed, wherein the first temperature is greater than 500 degrees Celsius.

11. The method of claim 10, further comprising:

removing the second layers from the nanowire stack after the S/D material is formed in the S/D cavity;

forming a gate dielectric and a high-k material over the first layers after the second layers are removed;

annealing the nanowire stack after the gate dielectric and the high-k material are formed;

forming a contact etch stop layer over the S/D material after the nanowire stack is annealed; and performing a second implant by directing fluorine ions to the nanowire stack after the contact etch stop layer is formed.

12. The method of claim 11, wherein the second implant is performed at a second temperature, and wherein the second temperature is less than the first temperature of the first implant.

13. The method of claim 9, wherein the first implant comprises a plasma doping process.

14. The method of claim 9, wherein the nanowire stack is part of a complementary field effect transistor comprising a p-type nanosheet beneath an n-type nanosheet, and wherein the S/D cavity is formed through the p-type nanosheet and the n-type nanosheet.

15. A system, comprising:

a processor;

a memory storing instructions executable by the processor to perform a first implant by directing fluorine ions into a gate-all-around (GAA) stack comprising a plurality of alternating first layers and second layers formed atop a substrate base, wherein the fluorine ions are directed through a source/drain cavity formed adjacent the GAA stack, and wherein the fluorine ions are directed into the GAA stack at a first non-zero angle relative to a plane defined by a sidewall surface of an inner spacer and at a second non-zero angle relative to a plane defined by an upper surface of the substrate base, and wherein the inner spacer is formed along the GAA stack before the fluorine ions are directed through a source/drain cavity.

16. The system of claim 15, the memory further storing instructions executable by the processor to epitaxially form a source/drain in the source/drain cavity following the first implant.

17. The system of claim 16, the memory further storing instructions executable by the processor to:

remove the second layers from the GAA stack after the source/drain material is formed in the source/drain cavity;

form a gate dielectric and a high-k material over the first layers after the second layers are removed;

anneal the GAA stack after the gate dielectric and the high-k material are formed;

form a contact etch stop layer over the source/drain after the GAA stack is annealed; and perform a second implant by directing fluorine ions to the GAA stack after the contact etch stop layer is formed.

18. The system of claim 17, wherein the first implant is performed at a first temperature greater than 500 degrees Celsius, and wherein the second implant is performed at a second temperature greater than 150 degrees Celsius, wherein the second temperature is less than the first temperature.

19. The system of claim 15, wherein the first implant comprises a plasma doping process.

\* \* \* \* \*